US006887625B2

(12) United States Patent
Baselmans et al.

(10) Patent No.: US 6,887,625 B2
(45) Date of Patent: May 3, 2005

(54) ASSIST FEATURES FOR USE IN LITHOGRAPHIC PROJECTION

(75) Inventors: Johannes Jacobus Matheus Baselmans, Oirschot (NL); Markus Schluter, Eindhoven (NL); Donis George Flagello, Scottsdale, AZ (US); Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 267 days.

(21) Appl. No.: 09/905,198

(22) Filed: Jul. 16, 2001

(65) Prior Publication Data

US 2002/0045106 A1 Apr. 18, 2002

Related U.S. Application Data

(60) Provisional application No. 60/244,657, filed on Nov. 1, 2000.

(30) Foreign Application Priority Data

Jul. 21, 2000 (EP) ........................................ 00306237

(51) Int. Cl.[7] ............................ G03F 9/00; G03C 5/00; G06F 17/50

(52) U.S. Cl. ............................ 430/5; 430/30; 430/311; 430/396; 716/19

(58) Field of Search .............................. 430/5, 30, 311, 430/396, 22; 716/19

(56) References Cited

U.S. PATENT DOCUMENTS 5,585,210 A * 12/1996 Lee et al. ...................... 430/5
6,001,512 A * 12/1999 Tzu et al. ...................... 430/5
6,074,787 A 6/2000 Takeuchi

OTHER PUBLICATIONS

Kroyan et al., "Effects of Sub–Resolution Assist Features on Depth of Focus and Uniformity of Contact Windows for 193 nm Lithography, " *Part of the SPIE Conference on Optical Microlithography XII*, Santa Clara, CA, Mar. 1999, vol. 3679, pt. 1–2, pp. 630–638.

Peter D. Buck et al., "Phase Shift Mask Applications," Proceedings of SPIE—The International Society for Optical Engineering, Optical/Laser Microlithography IV, Mar. 6–8, 1991, Coversheet + 9 pages.

Tsuneo Terasawa et al., "Improved resolution of an *i*–line stepper using a phase–shifting mask,"J. Vac. Sci. Technol B., vol. 8 No. 6 Nov/Dec 1990, pp. 1300–1308.

Yong Liu et al., "Computer Aided Phase Shift Mask Design with Reduced Complexity," Department of Electrical Engineering and Computer Sciences, University of California at Berkeley, CA 94720, SPIE vol. 1927 Optical/Laser Microlithography VI (1993) pp. 477–493.

* cited by examiner

*Primary Examiner*—Mark Huff
*Assistant Examiner*—Saleha Mohamedulla
(74) *Attorney, Agent, or Firm*—Pillsbury Winthrop LLP

(57) ABSTRACT

In a mask pattern for a device such as a DRAM including a nearly regular array of isolated features, assist features are positioned so as to make the array more symmetric. Where the isolated features are positioned at most but not all of the points of a regular unit cell, the assist features may be positioned at the points of the unit cell not occupied by the isolated features. The isolated features may represent contact holes.

62 Claims, 9 Drawing Sheets

ASSIST FEATURES FOR USE IN LITHOGRAPHIC PROJECTION

This application claims the benefit of U.S. Provisional Application No. 60/244,657, filed Nov. 1, 2000, herein incorporated by reference.

BACKGROUND OF THE INVENTION

1. Field of the Invention

The present invention relates to generally to photolithographic masks and specifically to photolithographic masks having assist features and to methods for use thereof.

2. Description of the Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The illumination system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively.

In the present document, the terms "radiation" and "beam" are used to encompass all types of electromagnetic radiation, including, but not limited to, ultraviolet radiation (e.g. at a wavelength of 365 nm, 248 nm, 193 nm, 157 nm or 126 nm) and extreme ultraviolet radiation (EUV); in principle, these terms also encompass X-rays, electrons and ions. Also herein, the invention is described using a reference system of orthogonal X, Y and Z directions, and rotation about an axis parallel to the I direction is denoted Ri. Further, unless the context otherwise requires, the term "vertical" (Z) used herein is intended to refer to the direction normal to the substrate or mask surface or parallel to the optical axis of an optical system, rather than implying any particular orientation of the apparatus. Similarly, the term "horizontal" refers to a direction parallel to the substrate or mask surface or perpendicular to the optical axis, and thus normal to the "vertical" direction.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion or exposure area (comprising one or more dies) on a substrate (silicon wafer) which has been coated with a layer of radiation sensitive material (resist). In general, a single wafer will contain a whole network of adjacent target portions that are successively irradiated via the reticle, one at a time. In one type of lithographic projection apparatus, each target portion is irradiated by exposing the entire mask pattern onto the target portion at once; such an apparatus is commonly referred to as a wafer stepper. In an alternative apparatus C which is commonly referred to as a step-and-scan apparatus C each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned from International Patent Application WO97/33205, for example.

In general, lithographic apparatus contain a single mask table and a single substrate table. However, machines are becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial metrology steps on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and loading positions.

It is known to provide so-called "assist features" in masks to improve the image projected onto the resist and ultimately the developed device. Assist features are features that are not intended to appear in the pattern developed in the resist but are provided in the mask to take advantage of diffraction effects so that the developed image more closely resembles the desired circuit pattern. Assist features are generally "sub-resolution" meaning that they are smaller in at least one dimension than the smallest feature in the mask that will actually be resolved on the wafer. Assist features may have dimensions defined as fractions of the "critical dimension", which is the smallest width of a feature or smallest separation between features in the mask and is often the resolution limit of the lithographic projection apparatus with which the mask is to be used. Note though that because the mask pattern is generally projected with a magnification of less than 1, e.g. ¼ or ⅕, the assist feature on the mask may have a physical dimension larger than the smallest feature on the wafer. Two types of assist features are known. Scattering bars are lines with a sub-resolution width placed on one or both sides of an isolated conductor to mimic proximity effects that occur in densely packed regions of a pattern. Serifs are additional areas of various shapes placed at the corners and ends of conductor lines, or the corners of rectangular features, to make the end of the line, or the corner, more nearly square or round, as desired (note in this context that assist features commonly referred to as "hammerheads" are regarded as being a form of serif). Further information on the use of scattering bars and serifs can be found in U.S. Pat. Nos. 5,242,770 and 5,707,765, for example, which are incorporated herein by reference.

Contact holes, or vias, in integrated circuits cause particular problems in imaging. Because the contact holes often have to be formed through numerous or relatively thick process layers previously formed on the wafer, they must be patterned into a relatively thick layer of photoresist, requiring an increased depth of focus in the aerial image of the mask pattern.

SUMMARY OF THE INVENTION

One aspect of an embodiment of the present invention provides an improved mask for better imaging of regularly- or irregularly-spaced dense features, such as contact holes, as well as a method of making such a mask and a method of manufacturing devices using the improved mask.

According to one embodiment of the present invention there is provided a mask for use in a lithographic projection apparatus, the mask comprising a plurality of isolated areas that contrast with the background and represent features to be printed in manufacture of a device, said isolated areas arranged generally in an array including a plurality of assist features smaller than said isolated areas and positioned so as to make said array more symmetric.

The assist features, by reducing asymmetry in the array, tend to reduce aberrations in the aerial image and are ideally located so as to reduce all asymmetric aberrations, caused by odd aberrations such as 3-wave and coma. In an array that already has some degree(s) of symmetry, the assist features may add additional degrees of symmetry or may make a unit (primitive) cell more symmetric within itself. In this way, the invention can provide improvements in imaging symmetry that are largely independent of exposure device and illumination or projection settings. In many cases, the isolated features can be seen as occupying lattice points of a regular array (though the isolated features may be displaced slightly from the points of an ideal lattice) but with one or more of the points of the unit, or primitive, cell being vacant. In this case, the assist features are placed at at least some of the vacant lattice points.

An array of features in a mask which is itself regular, e.g. having one or more degrees of rotational or reflective symmetry, is inevitably finite and hence lacks translation symmetry; the unit cells at the edges of the array are not exactly equivalent to those in the middle as they have fewer neighbors. Thus, assist features according to the invention may be placed around the outside of an array to form pseudo-neighbors for the outermost features in the array. Of course, multiple assist features of different locations may be used in an array with, for example, assist features placed within the array to make the array more rotationally or reflectively symmetric and outside the array to make the surroundings of the outermost features more similar to the inner features.

The assist features should be sufficiently small in at least one dimension so as not to appear in the developed pattern of the resist, though they may be detectable in the aerial image and may partially expose the photo-(energy sensitive) resist. The assist features are therefore generally smaller than the critical dimension of the mask pattern and the resolution limit of the lithographic apparatus with which the mask is to be used.

The isolated areas may for example represent contact holes to be formed in a DRAM array. The isolated areas and assist features may be transparent areas on a relatively opaque background or vice versa. In a reflective mask, the isolated areas and assist features will have a different reflectivity than the background. In a phase shift mask, the isolated areas and assist features may introduce a different phase shift and/or a different attenuation than the background. The assist features need not have the same "tone" as the isolated areas.

According to another aspect of the invention there is provided a method of making a mask for use in a lithographic projection apparatus, including defining a plurality of isolated areas that contrast with the background and that represent features to be printed in manufacture of a device, said isolated areas arranged generally in an array, defining a plurality of assist features smaller than said isolated areas and positioned so as to make said array more symmetric.

The positions, shapes and sizes of the assist features may be determined by calculating aberrations in the wavefront that would be produced by the pattern without them and then determining positions, etc., for the assist features that reduce the predicted aberrations, especially 3 wave and 1 wave (comatic) aberrations.

According to a further aspect of the present invention there is provided a method of manufacturing a device using a lithographic projection apparatus including an illumination system for supplying a projection beam of radiation, a first object table provided with a first object holder for holding a mask, a second object table provided with a second object holder for holding a substrate and a projection system for imaging an irradiated portion of the mask onto a target portion of the substrate; the method including providing a mask bearing a pattern to said first object table, said mask comprising a plurality of isolated areas that contrast with the background and represent features to be printed in manufacture of a device, said isolated areas arranged generally in an array, providing a substrate having a radiation-sensitive layer to said second object table and imaging said irradiated portions of the mask onto said target portions of the substrate and said mask being provided with a plurality of assist features smaller than said isolated areas and positioned so as to make said array more symmetric.

In a manufacturing process using a lithographic projection apparatus according to the invention a pattern in a mask is imaged onto a substrate which is at least partially covered by a layer of radiation sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices (dies) will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion" or "exposure area", respectively.

Although this text has concentrated on lithographic apparatus and methods whereby a mask is used to pattern the radiation beam entering the projection system, it should be noted that the invention presented here should be seen in the broader context of lithographic apparatus and methods employing generic "patterning structure" to pattern the said radiation beam. The term "patterning structure" as here employed refers broadly to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. Besides a mask on a mask table, such patterning structure include the following exemplary embodiments:

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

The text and claims of this document should be interpreted as encompassing such generic patterning structure, as alternatives for a mask.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION

Lithographic Projection Apparatus

Figure 1:
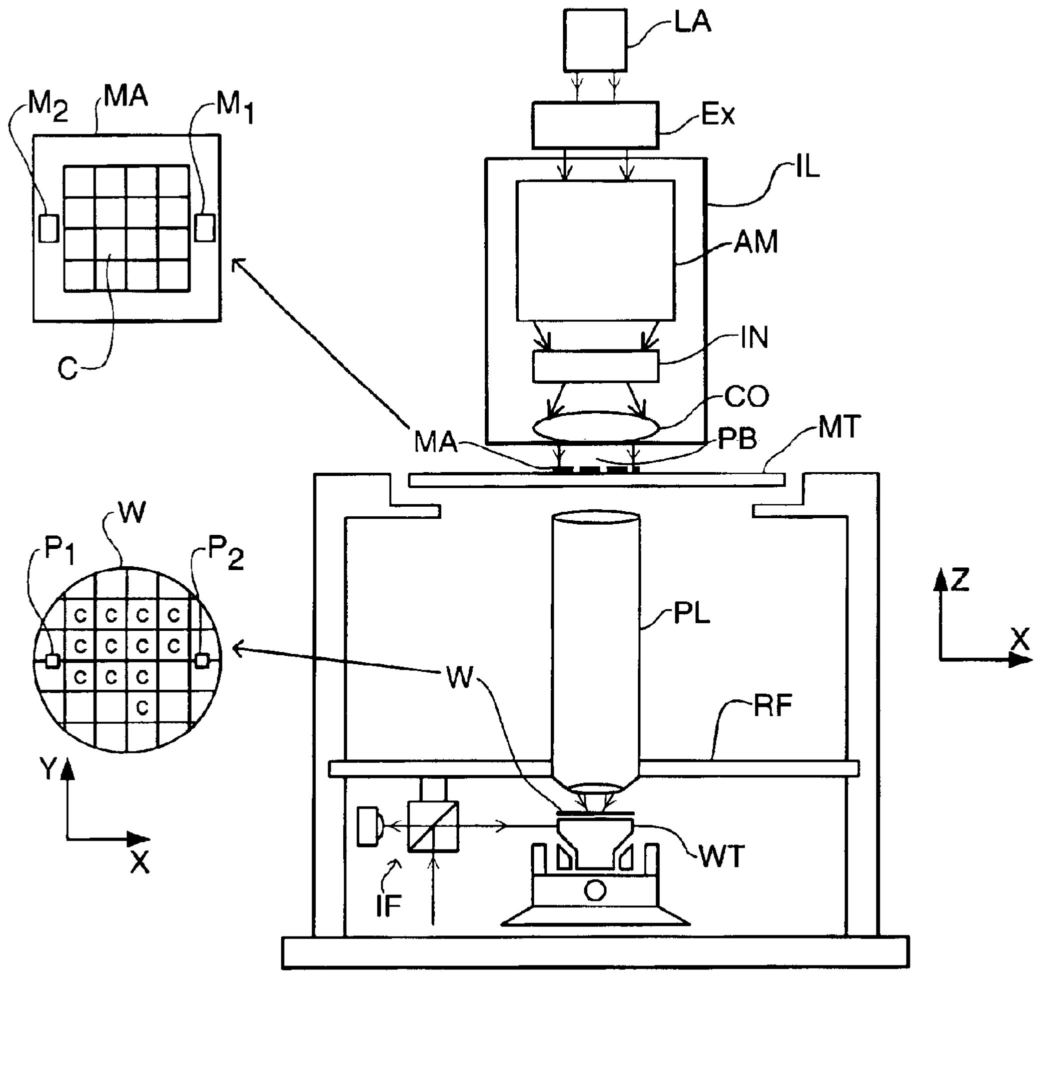
FIG. 1 depicts a lithographic projection apparatus with which embodiments of the invention can be used.

FIG. 1 schematically depicts a lithographic projection apparatus that may be used with the invention. The apparatus comprises:

- a radiation system Ex, IL, for supplying a projection beam PB of radiation (e.g. UV or EUV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catadioptric or catoptric system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array or LCD as referred to above.

The source LA (e.g. a lamp, laser or discharge plasma chamber) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1.

However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Embodiment 1

Figure 2:
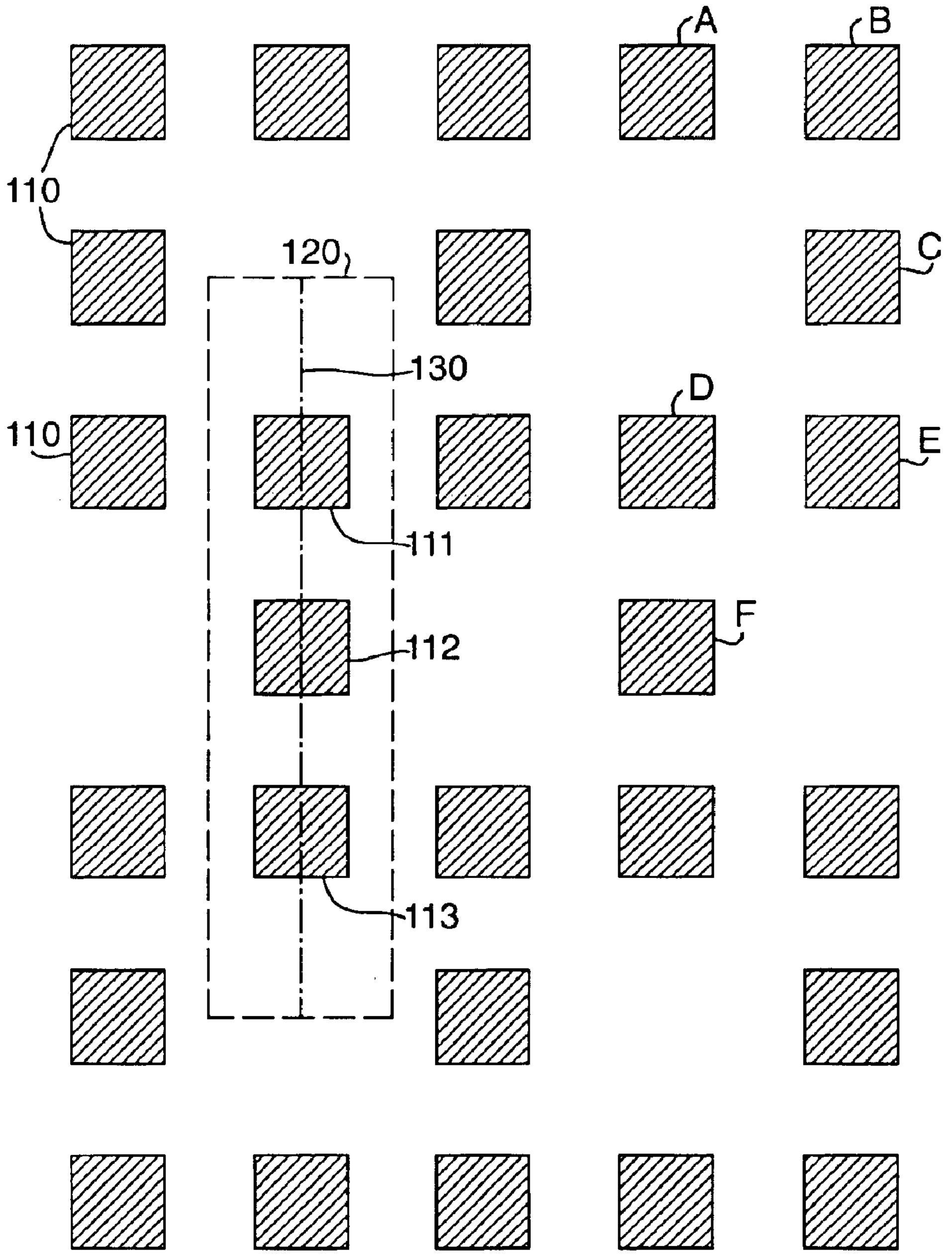
FIG. 2 depicts a part of a mask pattern for printing contact holes in the manufacture of a dynamic random access memory (DRAM)

FIG. 2 shows part of a conventional 6% attenuated phase shift mask pattern which may be used in the lithographic projection apparatus described above for forming contact holes (vias) in a dynamic random access memory (DRAM) device. The mask pattern has an array of transparent areas 110, which let through the exposure radiation to expose the resist in the areas where contact holes are to be formed, in a substantially opaque field. It will be seen that the transparent areas are arranged such that a group of three, referenced 111, 112, 113, repeats regularly. The contact holes are 0.2 $\mu$m square with the spacing between contacts 0.2 $\mu$m. A reference area 120 of 0.4×1.6 $\mu m^2$ is also shown.

The inventors have discovered that these contact holes do not image correctly, being misshapen and displaced from their nominal positions.

According to the present invention, assist features are added to the mask pattern to make the array of features more nearly symmetric. Suitable positions and dimensions for the assist features are determined empirically by consideration of the Zernike coefficients representing wavefront aberrations in the image that will be produced from the pattern and postulated assist features.

The wavefront aberrations can be written as a series according to their angular form:

$$W(r,\theta)=\sum_m R_m(r)\cos(m\theta)+R'_m(r)\sin(m\theta)$$

where r and θ are radial and angular co-ordinates, respectively, (r is normalized) and m is an index indicating the contribution of the mth aberration. R and R' are functions of r.

The aberration can also be expressed in terms of the Zernike expansion:

$$W=Zif_i(r,\theta)+Zjf_j(r,\theta)+Zkf_k(r,\theta)+\ldots$$

where each Z is the Zernike coefficient and each $f$ is the corresponding Zernike polynomial. The functions f take the form of the product of a polynomial in r and sin or cos of mθ. For example, the comatic aberration (m=1) can be represented by a Zernike series in Z7, Z8, Z14, Z15, Z23, Z24, Z34, Z35 etc., and, for example, the function associated with the Z7 coefficient [$f_7(r,\theta)$ in the notation above] is:

$$(3r^3-2r)\cos(\theta)$$

The Zernike expansion for the lower-order aberrations is summarized in Table I below.

In particular, the inventors have determined that substantial improvements can be achieved by arranging assist features to manipulate the odd aberrations (odd m-numbers), especially the Z10 (3 wave) coefficient. Improvements can also be obtained by arranging assist features to reduce coma (1 wave) aberrations in the aerial image. The positions, shapes and sizes of assist features can be determined using known computational techniques, such as the program known as "Solid C", a commercial software package supplied by the company Sigma-C GmbH in Germany, for simulating and modeling optical lithography. Other suitable software packages, such as one known as "Prolith", may alternatively be used.

TABLE I

| Aberration | | Low-order Zernikes | | Higher orders |
|---|---|---|---|---|
| m | Name | Function | Term | Term |
| 0 | spherical | $6r^4-6r^2+1$ | Z9 | Z16, Z25, Z36, Z37 |
| 1 | X-coma | $(3r^3-2r)\cos\theta$ | Z7 | Z14, Z23, Z34 |
| 1 | Y-coma | $(3r^3-2r)\sin\theta$ | Z8 | Z15, Z24, Z35 |
| 2 | astigmatism | $r^2\cos 2\theta$ | Z5 | Z12, Z21, Z32 |
| 2 | 45° astigmatism | $r^2\sin 2\theta$ | Z6 | Z13, Z22, Z33 |
| 3 | X- three-point | $r^3\cos 3\theta$ | Z10 | Z19, Z30 |
| 3 | Y- three-point | $r^3\sin 3\theta$ | Z11 | Z20, Z31 |

In the DRAM example, improvements are achieved by regarding the six repeated transparent areas (see FIG. 3) as two pairs of triplets A, B, C and D, E, F with each member of the triplet occupying one of the four corners of a square (in this example) unit cell. According to the invention, assist features 151, 152 are placed at the fourth corners and comprise a transparent square of a size too small to be printed in the developed pattern. The squares can be 0.12 $\mu$m each side, for example. Note that the assist features may be visible in the aerial image and partly expose the resist but be washed out in development of the resist.

Figure 3:
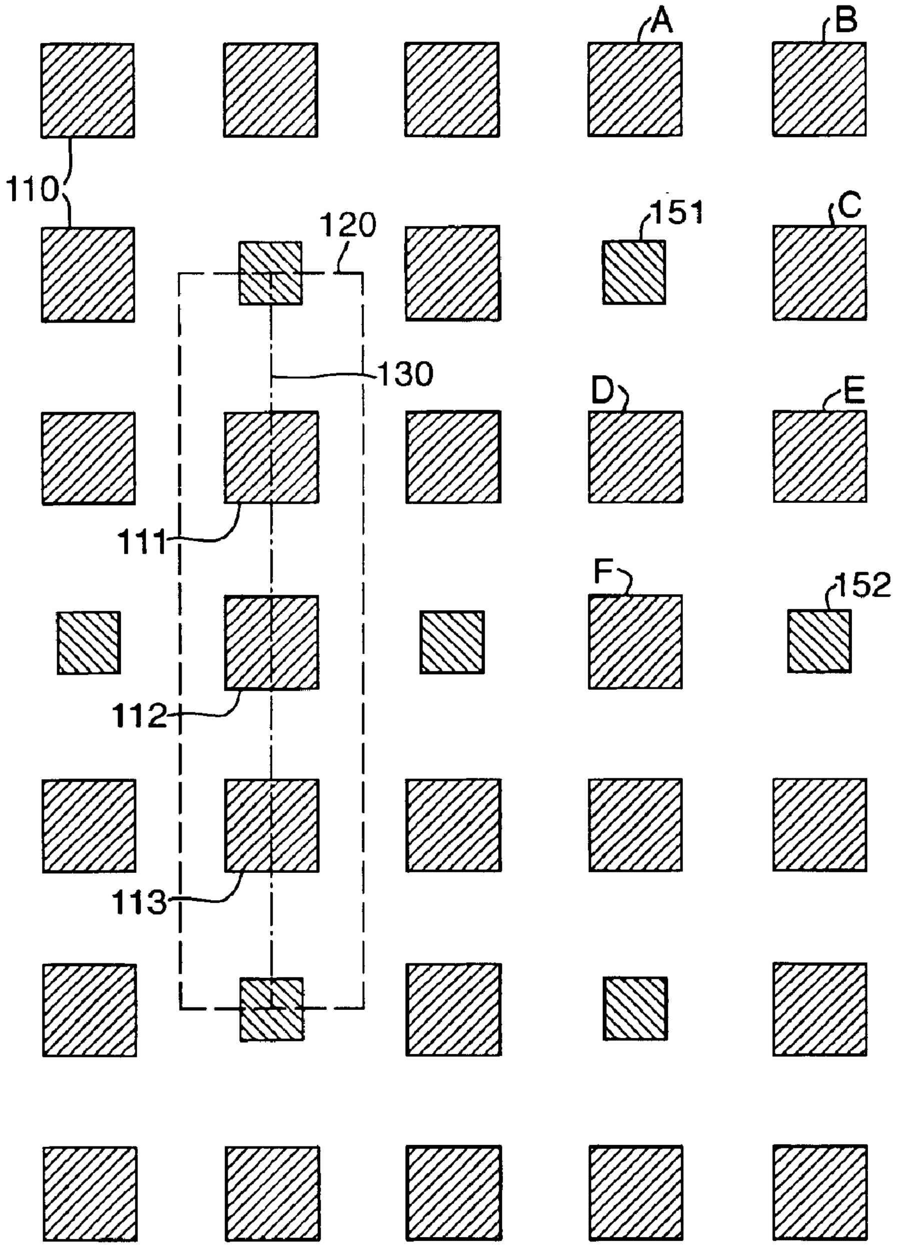
FIG. 3 depicts a part of a mask pattern according to a first embodiment of the present invention for printing contact holes in a DRAM.
Figure 4:
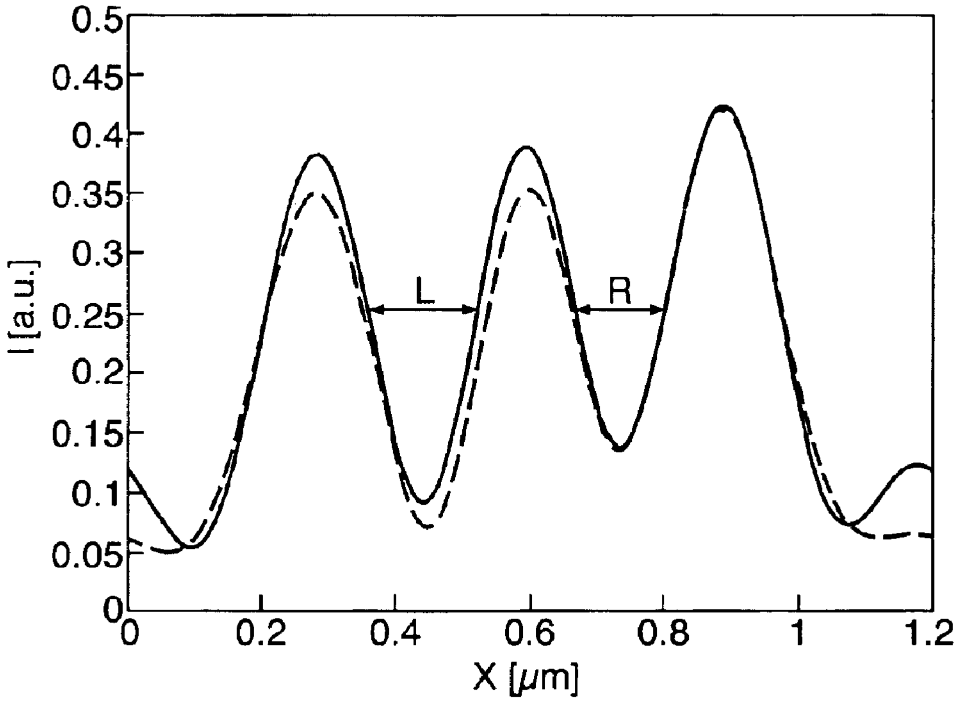
FIG. 4 is a graph of intensities of part of the aerial images produced by the mask patterns of FIGS. 2 and 3.

The efficacy of the present invention is seen in FIG. 4 which is a graph of intensity in the aerial images produced by the mask patterns of FIGS. 2 and 3 corresponding to the line 130. In FIG. 4 the solid line represents the intensity of the aerial images produced by the mask pattern according to the invention (FIG. 3) and the dashed line represents the intensity of the aerial image produced by the conventional mask pattern (FIG. 2). The asymmetry of printing can be represented by the distances L and R shown in FIG. 4; these represent the distances between the peaks which will form the contact holes, measured at the resist threshold, chosen as 0.25 in the arbitrary units of the graph of FIG. 4. It can be seen that the distance L is reduced with the invention so that the asymmetry represented by the difference L–R is also reduced.

Embodiment 2

Figure 5:
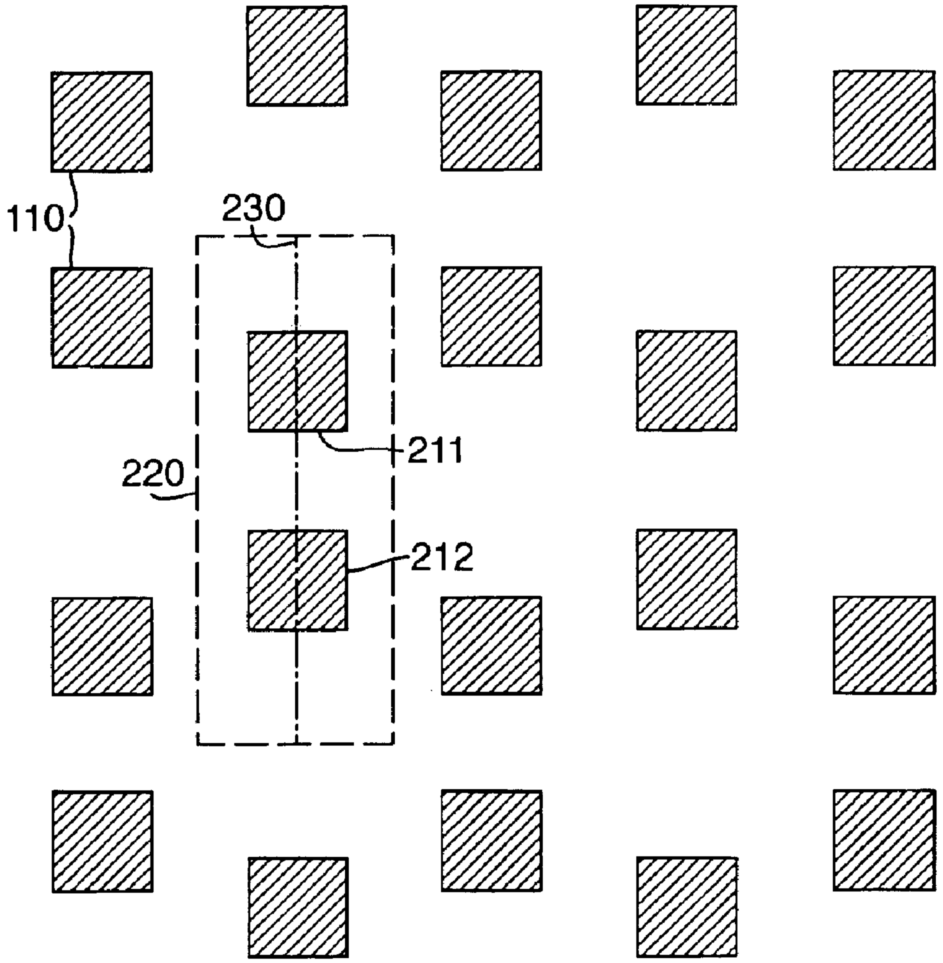
FIG. 5 depicts a part of an alternative mask pattern for printing contact holes.
Figure 6:
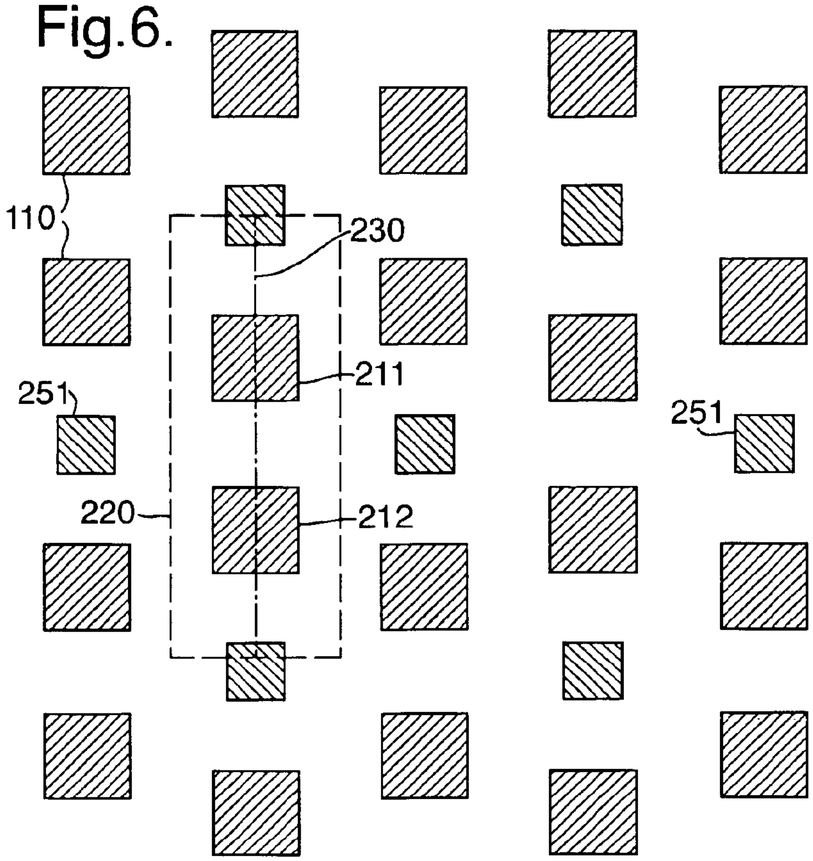
FIG. 6 depicts a part of a mask pattern according to a second embodiment of the invention.

FIG. 5 shows an alternative arrangement of contact holes 110. In this arrangement a pair of contact holes 211, 212 repeats to form a honeycomb structure. The contact holes may be 0.2 $\mu$m square with a spacing between adjacent contacts of 0.2 $\mu$m. Also shown is a reference area 220 of 0.4×0.9 $\mu m^2$. According to the invention, the symmetry of this mask pattern is improved, as shown in FIG. 6, by adding an additional assist feature 251 at the center of each honeycomb cell. The assist features 251 may be square of side 0.12 μm, for example.

Figure 7:
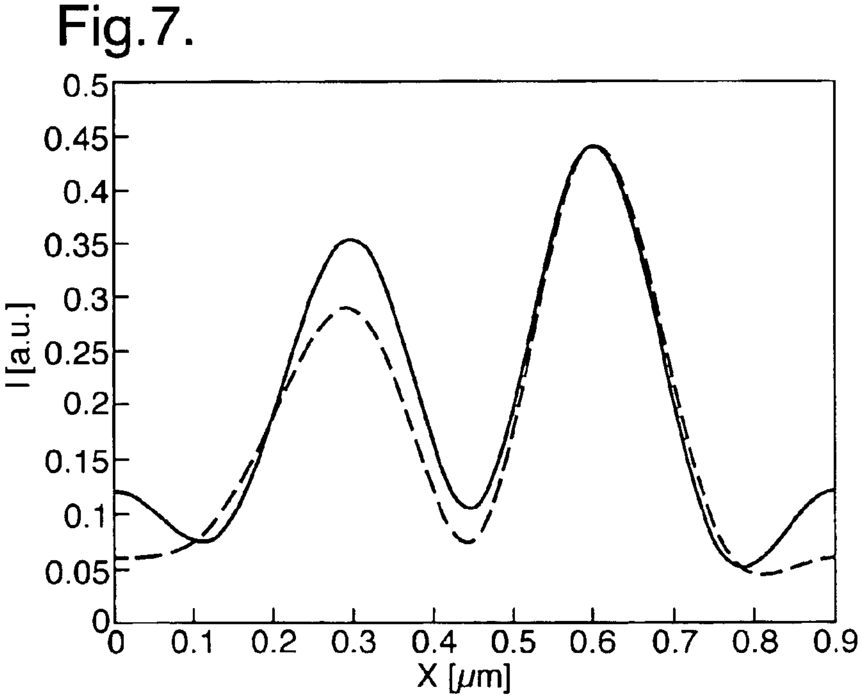
FIG. 7 is a graph of intensities of part of the aerial images produced by the mask patterns of FIGS. 5 and 6.

The improvement provided by the present invention in the second embodiment can be seen in FIG. 7 which is a graph of intensities of the aerial images produced by the mask patterns of FIGS. 5 and 6 along the line 230. As with FIG. 4, the solid line represents the intensity of the image produced by the mask pattern according to the invention (FIG. 6) and the dashed line that of the conventional pattern (FIG. 5). It will clearly be seen that the aerial image produced by the pattern according to the invention is less asymmetric.

Embodiment 3

Figure 8:
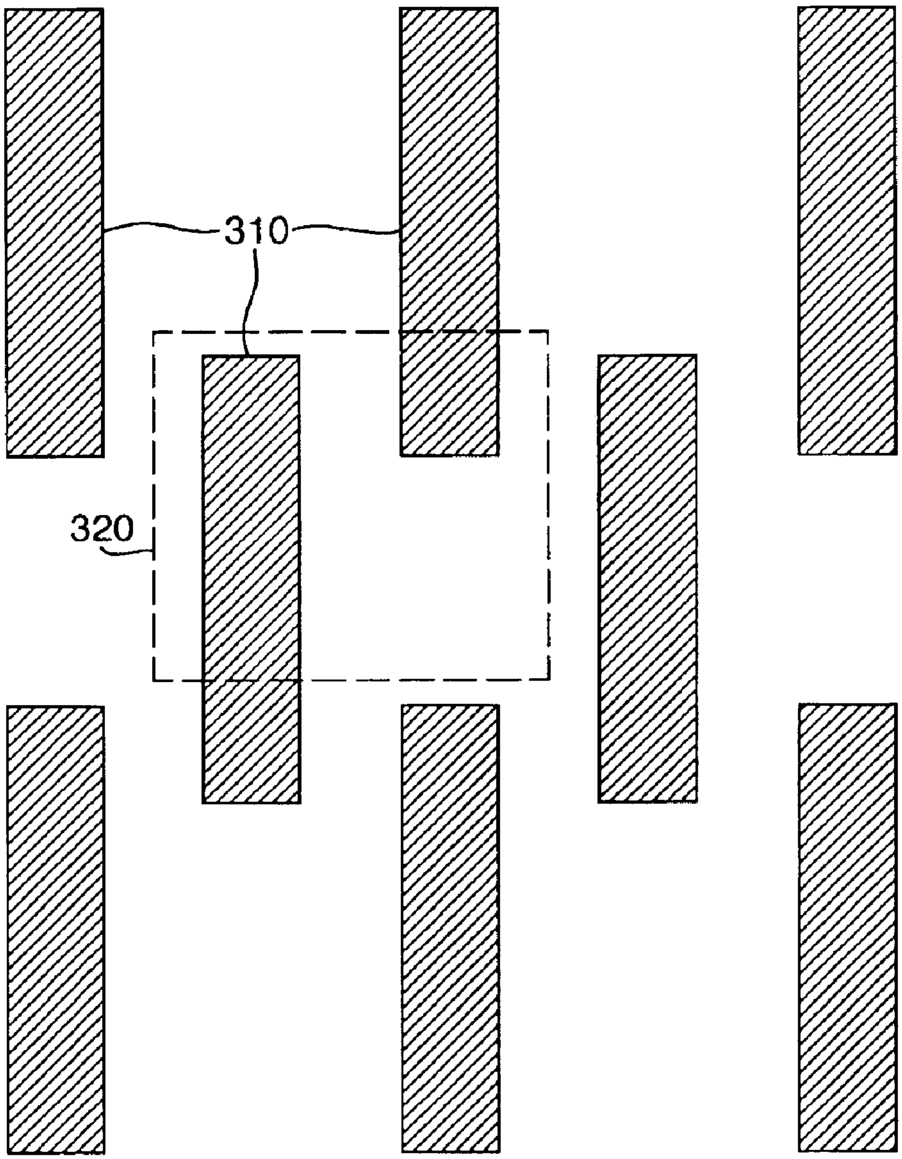
FIG. 8 depicts part of a mask pattern for printing rectangular features.
Figure 9:
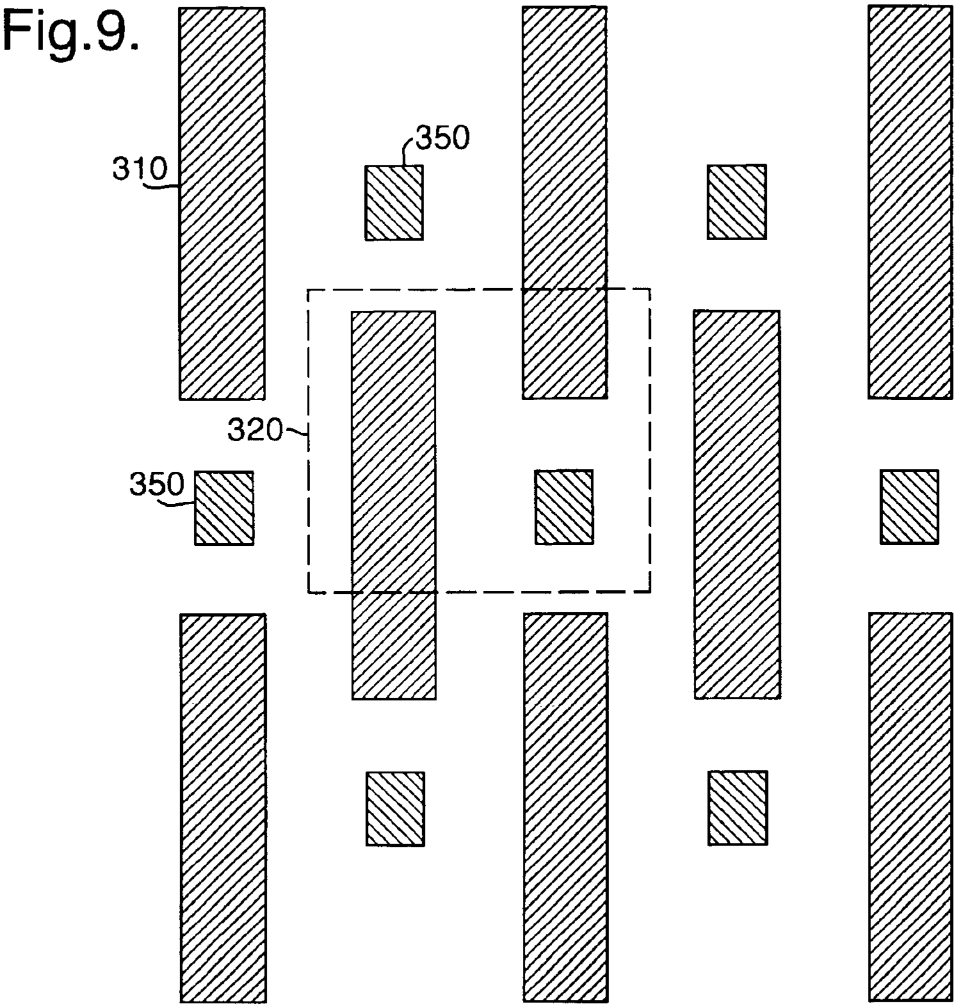
FIG. 9 depicts part of a mask pattern according to a third embodiment of the invention for printing rectangular features.

FIG. 8 shows a conventional "brick wall" pattern of rectangles arranged in a staggered array. The rectangles are 0.2×0.5 $\mu m^2$ with a spacing between adjacent rectangles of 0.2 μm. The reference area 320 is 0.6×0.6 $\mu m^2$. As shown in FIG. 9, according to the invention, assist features 350 are placed between the rectangles 310. The assist features may again be 0.12 μm on each side, for example.

Figure 10:
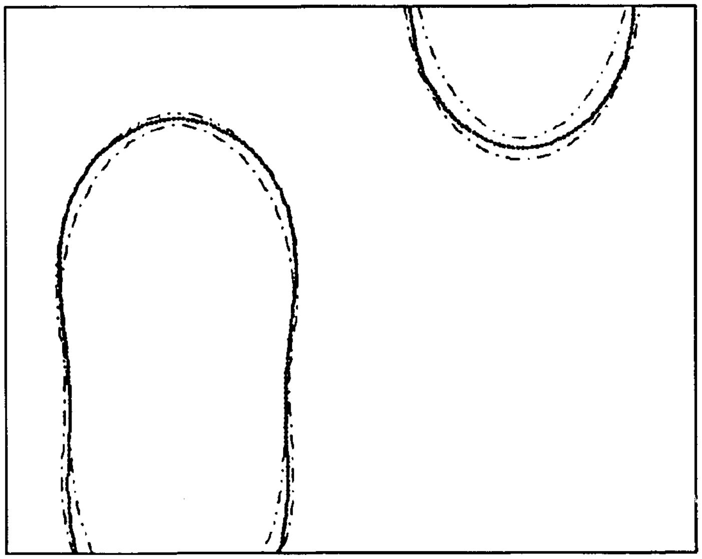
FIG. 10 is a contour plot of intensities of a part of the aerial images produced by the mask patterns of FIGS. 8 and 9.

FIG. 10 is a contour plot at a 0.25 (arbitrary units) intensity threshold of the aerial image produced by the unit cell 320. The finely-dashed line represents the image produced by the present invention (FIG. 9) while the single-chain line represents that produced by the conventional mask pattern (FIG. 8). The double-chain line represents an ideal aerial image of the mask pattern with no 3 wave aberration. It will clearly be seen that the image provided by the present invention is closer to the ideal.

Embodiment 4

Figure 11:
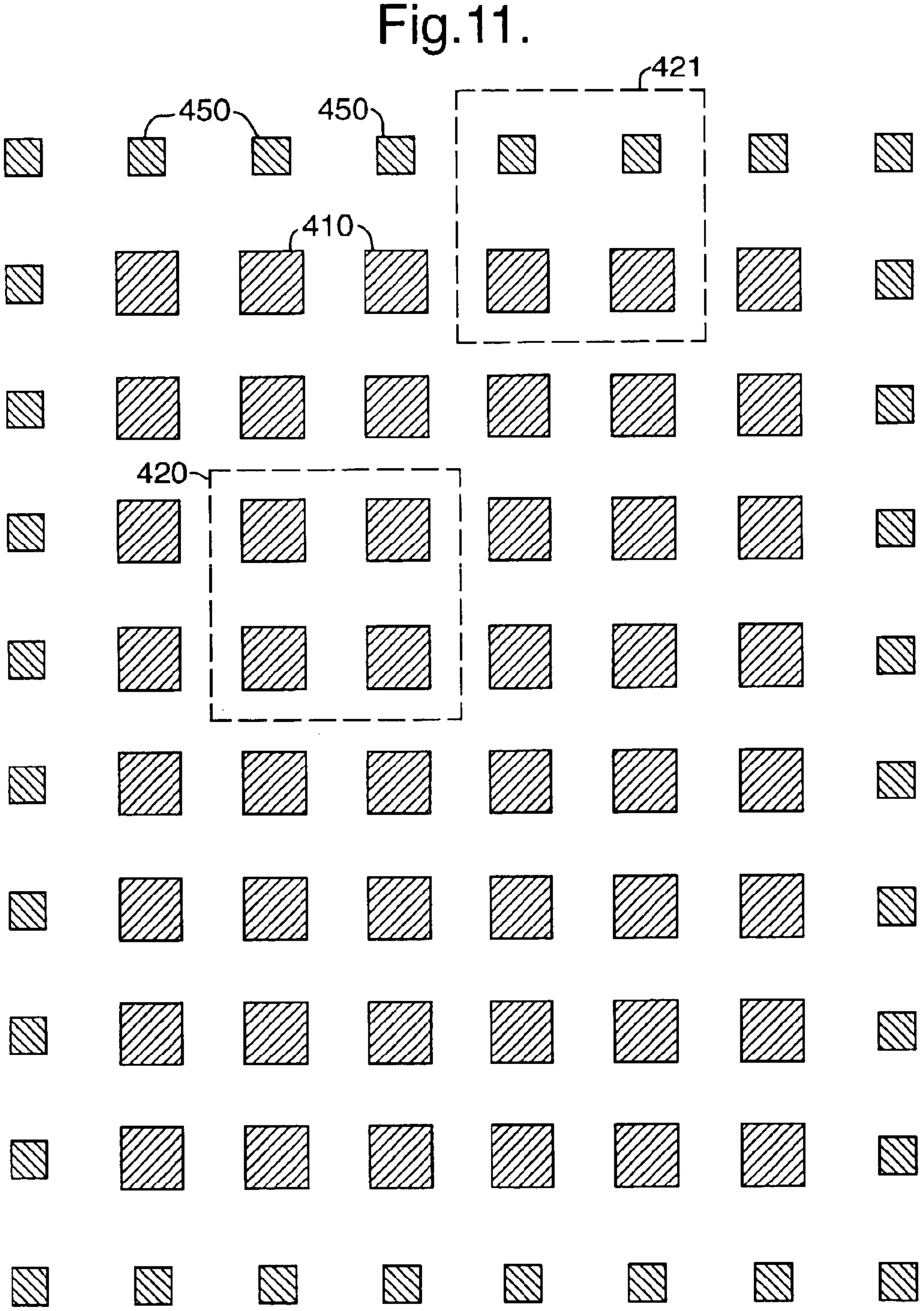
FIG. 11 depicts part of a mask pattern according to a fourth embodiment of the invention.

FIG. 11 shows a mask pattern according to a fourth embodiment of the invention. This array comprises a regular rectangular array of features, e.g. contact holes 410. This array in itself is extremely regular and has a high degree of internal symmetry. However, by comparing the features within cell 420 with those within cell 421, it will be seen that there is a difference. The features 410 within cell 420 have neighbors on all sides whereas the features 410 in cell 421 have no neighbors outside them. Thus, according to the invention, assist features 450 are provided outside the array of features 410 to provide pseudo-neighbors for the features at the edge of the regular array. Thus, cell 421 becomes more similar to cell 420. Accordingly, the assist features improve the translational symmetry of the array in that the viewpoint from a printing feature 410 at the edge of the array is made more similar to the viewpoint from a printing feature 410 in the middle of the array.

The sizes of the printing features 410 and assist features 450 may be similar to those of embodiments 1 to 3 and modified as desired for a specific use of the invention. Where the printing features forming the array are not square, the assist features may also be non-square but again sufficiently small so as to not print. Assist features around the outside of an array may of course be used in conjunction with assist features within the array itself. Further, where the image of a given assist feature is affected by features further away than its nearest neighbors, additional rows of assist features may be provided as necessary. In general, it would be preferable to provide assist features around all sides of the array of printing features but the presence of other features near the array may make the provision of assist features around the entire periphery of the array unnecessary and/or impractical. While in FIG. 11 the assist features are shown spaced from the array by a distance equal to the array pitch, this distance may of course be varied to alter the effect of the assist features as desired.

While we have described above specific embodiments of the invention it will be appreciated that the invention may be practiced otherwise than as described. The description is not intended to limit the invention. It should be explicitly noted that the present invention can be applied to any mask pattern having an (asymmetric) array or group of features. It should also be noted that the invention is applicable where the array comprises only part of the mask pattern, for example in the manufacture of system-on-chip devices combining memory and logic or processors on a single device.

What is claimed is:

1. A mask for use in a lithographic apparatus, the mask comprising a plurality of isolated areas that contrast with a background and represent features to be printed in manufacture of a device, said isolated areas being arranged in an array such that at least part of each isolated area is adjacent to at least part of at least one other isolated area in the array; and a plurality of non-printing assist features smaller than and distinct from said isolated areas, at least one of said plurality of assist features being positioned so as to make an aerial image of one of said isolated areas more similar to an aerial image of another of said isolated areas, wherein an axis of symmetry of said at least one assist feature, an axis of symmetry of the array, and an axis of symmetry of at least one of said isolated areas are substantially coincident.

2. A mask according to claim 1, wherein said mask comprises a plurality of unit cells, each having substantially the same shape, said array being disposed within one of said unit cells.

3. A mask according to claim 2, wherein for at least one regular unit cell of the mask, at least one isolated area within the regular unit cell is positioned proximate at least one of the points of the regular unit cell and at least one assist feature is positioned proximate a point of the regular unit cell not occupied by the isolated areas.

4. A mask according to claim 3 wherein said isolated areas are positioned at three corners of a rectangular unit cell and at least one of said assist features is positioned at the fourth corner.

5. A mask according to claim 1 wherein said at least one assist feature is positioned so as to reduce the effect of at least one odd aberration in a wavefront produced by said array when illuminated by exposure radiation in said lithographic apparatus.

6. A mask according to claim 1 wherein said assist features are positioned at a periphery of said array so as to increase a similarity between aerial images of isolated areas near the periphery of the array and an aerial image of an isolated area near a center of the array.

7. A mask according to claim 1 wherein said at least one assist feature is positioned so as to reduce the effect of at least one of the group consisting of three-wave aberration and comatic aberration in a wavefront produced by said array when illuminated by exposure radiation in said lithographic apparatus.

8. A mask according to claim 1 wherein said assist features have a contrast to the background of said mask substantially equal to a contrast to the background of said mask of said isolated areas.

9. A mask according to claim 1 wherein said isolated areas are more transparent to exposure radiation of said lithographic apparatus than said background.

10. A mask according to claim 1 wherein said isolated areas are more reflective of exposure radiation of said lithographic apparatus than said background.

11. A mask according to claim 1 wherein said isolated areas are configured to impart a different phase shift than said background.

12. A mask according to claim 1 wherein said assist features are smaller than a critical dimension of said mask.

13. A mask according to claim 12 wherein said assist features are smaller than a resolution limit of said lithographic apparatus.

14. A method of making a mask for use in a lithographic apparatus, the method comprising:

defining a plurality of isolated areas that contrast with a background and represent features to be printed in manufacture of a device, said isolated areas being arranged in an array such that at least part of each isolated area is adjacent to at least part of at least one other isolated area in the array; and defining a plurality of non-printing assist features smaller than and distinct from said isolated areas, at least one of said plurality of assist features being positioned so as to make an aerial image of one of said isolated areas more similar to an aerial image of another of said isolated areas, wherein an axis of symmetry of said at least one assist feature, an axis of symmetry of the array, and an axis of symmetry of at least one of said isolated areas are substantially coincident.

15. A method according to claim 14, wherein said defining a plurality of non-printing assist features comprises:

determining at least one wavefront aberration in an aerial image to be produced in said lithographic apparatus by said array; and determining a position, shape, and size for at least one of said plurality of non-printing assist features so as to reduce said at least one wavefront aberration in said aerial image.

16. A method according to claim 15 wherein said position is determined so as to reduce at least one of the group consisting of three-wave aberration and comatic aberration.

17. A method of manufacturing a device using a lithographic apparatus comprising:

imaging irradiated portions of a mask onto target portions of a substrate, wherein said mask is provided with a plurality of isolated areas that contrast with a background and represent features to be printed in manufacture of a device, said isolated areas being arranged in an array such that at least part of each isolated area is adjacent to at least part of at least one other isolated area in the array, and a plurality of non-printing assist features smaller than and distinct from said isolated areas, at least one of said plurality of assist features being positioned so as to make an aerial image of one of said isolated areas more similar to an aerial image of another of said isolated areas, wherein an axis of symmetry of said at least one assist feature, an axis of symmetry of the array, and an axis of symmetry of at least one of said isolated areas are substantially coincident.

18. A method according to claim 16 wherein said device includes a memory array.

19. A method according to claim 17 wherein said imaging includes directing a beam patterned by the mask onto the target portions, and wherein said assist features have a largest dimension less than 50% of a principal wavelength of said beam.

20. A method according to claim 19 wherein the largest dimension is in the range of from 30 to 40% of a principal wavelength of said beam.

21. A mask for use in a lithographic apparatus, the mask comprising:

a plurality of isolated areas that contrast with a background and represent features to be printed on a substrate, said isolated areas being substantially mutually identical and arranged in an array such that at least part of each isolated area is adjacent to at least part of at least one other isolated area in the array; and a plurality of assist features that are smaller than a resolution limit of said apparatus, at least one of said plurality of assist features being arranged adjacent to a first edge of a first isolated area of the array and to a second edge of another isolated area, wherein the shortest distance between the first and second edges is at least twice the shortest distance from (A) the first edge to (B) an edge of the first isolated area opposite the first edge.

22. A mask according to claim 21, wherein said mask image is an image developed in a layer of photosensitive material.

23. A mask according to claim 1 wherein said assist features are configured to impart a different phase shift than said background.

24. A mask according to claim 1 wherein said isolated areas are configured to impart a different attenuation than said background.

25. A mask according to claim 1 wherein said assist features are configured to impart a different attenuation than said background.

26. A mask according to claim 1 wherein the elements of at least one of the group consisting of said assist features and said isolated areas is configured to impart a different one of at least one of the group consisting of phase shift, attenuation and tone than said background.

27. A computer program product including machine-readable instructions describing a method of making a mask for use in a lithographic apparatus, said method comprising:

defining a plurality of isolated areas that contrast with a background and represent features to be printed in manufacture of a device, said isolated areas being arranged in an array such that at least part of each isolated area is adjacent to at least part of at least one other isolated area in the array; and defining a plurality of non-printing assist features smaller than and distinct from said isolated areas, at least one of said plurality of assist features being positioned so as to make an aerial image of one of said isolated areas more similar to an aerial image of another of said isolated areas, wherein an axis of symmetry of said at least one assist feature, an axis of symmetry of the array, and an axis of symmetry of at least one of said isolated areas are substantially coincident.

28. The computer program product of claim 27, wherein said defining a plurality of non-printing assist features comprises:

determining at least one wavefront aberration in an aerial image to be produced in said lithographic apparatus by said array; and determining a position, shape, and size for at least one of said plurality of non-printing assist features so as to reduce said at least one wavefront aberration in said aerial image.

29. The computer program product of claim 28, wherein said position is determined so as to reduce at least one of the group consisting of three-wave aberration and comatic aberration.

30. The computer program product of claim 28, wherein said determining at least one wavefront aberration in an aerial image to be produced includes calculating said at least one wavefront aberration based on a definition of the plurality of isolated areas and a definition of at least one of the plurality of non-printing assist features.

31. The computer program product of claim 27, wherein said isolated areas are defined to impart a different phase shift than said background.

32. The computer program product of claim 27, wherein said assist features are defined to impart a different phase shift than said background.

33. The computer program product of claim 27, wherein said isolated areas are defined to impart a different attenuation than said background.

34. The computer program product of claim 27, wherein said assist features are defined to impart a different attenuation than said background.

35. The computer program product of claim 27, wherein the elements of at least one of the group consisting of said assist features and said isolated areas are defined to impart a different one of at least one of the group consisting of a phase shift, attenuation and tone than said background.

36. A mask for use in a lithographic apparatus, the mask comprising an array having a plurality of isolated areas that contrast with a background and represent features to be printed on a substrate, said isolated areas being arranged such that at least part of each isolated area is adjacent to at least part of at least one other isolated area; and a plurality of non-printing assist features smaller than said isolated areas, at least one of said plurality of non-printing assist features being arranged adjacent to a first edge of a first isolated area of the array and to a second edge of another isolated area, wherein the shortest distance between the first and second edges is at least twice the shortest distance from (A) the first edge to (B) an edge of the first isolated area opposite the first edge.

37. The mask according to claim 36, wherein said plurality of non-printing assist features are positioned to increase rotational symmetry of an aerial image of said array.

38. The mask according to claim 36, wherein said plurality of non-printing assist features are positioned to increase reflexive symmetry of an aerial image of said array.

39. The mask according to claim 36, wherein said plurality of non-printing assist features are positioned to increase translational symmetry of an aerial image of said array.

40. The mask according to claim 36, wherein said plurality of non-printing assist features are positioned to increase symmetry of an aerial image of said array along an axis of the aerial image.

41. The mask according to claim 36, said mask comprising a plurality of substantially identical unit cells, each having a unit cell array disposed therein that includes a plurality of isolated areas that contrast with a background and represent features to be printed on a substrate, said isolated areas of said unit cell array being arranged such that at least part of each isolated area of the unit cell array is adjacent to at least part of at least one other isolated area of the unit cell array; and a plurality of non-printing assist features smaller than said isolated areas, wherein said plurality of non-printing assist features are positioned to increase a symmetry of an aerial image of each of said unit cell arrays.

42. The mask according to claim 36, wherein each of said unit cells includes at least one isolated area positioned proximate a vertex of the unit cell and at least one non-printing assist feature positioned proximate another vertex of the unit cell.

43. The mask according to claim 36, wherein each of said unit cells is substantially rectangular and includes at least one isolated area positioned proximate to a corresponding one of each of three corners of the unit cell and at least one non-printing assist feature positioned proximate to the fourth corner of the unit cell.

44. The mask according to claim 36, wherein said isolated areas are more transparent to the exposure radiation of said lithographic apparatus than said background.

45. The mask according to claim 36, wherein said isolated areas are more reflective of the exposure radiation of said lithographic apparatus than said background.

46. The mask according to claim 36, wherein said isolated areas are configured to impart a different phase shift than said background.

47. The mask according to claim 36, wherein said assist features are smaller than a resolution limit of said lithographic apparatus.

48. A method of making a mask for use in a lithographic apparatus, the method comprising:

defining a plurality of isolated areas that contrast with a background and represent features to be printed in manufacture of a device, said isolated areas being arranged in an array such that at least part of each isolated area is adjacent to at least part of at least one other isolated area in the array; and defining a plurality of non-printing assist features smaller than said isolated areas, wherein said defining a plurality of non-printing assist features includes arranging at least one of said plurality of non-printing assist features to be adjacent to a first edge of a first isolated area of the array and to a second edge of another isolated area, and wherein the shortest distance between the first and second edges is at least twice the shortest distance from (A) the first edge to (B) an edge of the first isolated area opposite the first edge.

49. The method of making a mask according to claim 48, wherein said defining a plurality of assist features comprises:

determining at least one wavefront aberration in an aerial image to be produced in said lithographic apparatus by said array; and determining positions, shapes and sizes for said plurality of non-printing assist features so as to reduce said at least one wavefront aberration.

50. The method of making a mask according to claim 49, wherein said determining at least one wavefront aberration in an aerial image to be produced includes calculating said at least one wavefront aberration based on a definition of the plurality of isolated areas and a definition of the plurality of non-printing assist features.

51. The method of making a mask according to claim 48, wherein said isolated areas are defined to be more transparent to the exposure radiation of said lithographic apparatus than said background.

52. The method of making a mask according to claim 48, wherein said isolated areas are defined to be more reflective of the exposure radiation of said lithographic apparatus than said background.

53. The method of making a mask according to claim 48, wherein said isolated areas defined to impart a different phase shift than said background.

54. The method of making a mask according to claim 48, wherein said assist features are defined to be smaller than a resolution limit of said lithographic apparatus.

55. The mask according to claim 21, said mask comprising a plurality of substantially identical unit cells, each having a unit cell array disposed therein that includes a plurality of isolated areas that contrast with a background and represent features to be printed on a substrate, said isolated areas of said unit cell array being arranged such that at least part of each isolated area of the unit cell array is adjacent to at least part of at least one other isolated area of the unit cell array; and a plurality of non-printing assist features smaller than said isolated areas.

56. The mask according to claim 21, said mask comprising a plurality of regular unit cells, wherein each of said unit cells includes at least one of the plurality of isolated areas positioned proximate a vertex of the unit cell and at least one of the plurality of assist features positioned proximate another vertex of the unit cell.

57. The mask according to claim 21, said mask comprising a plurality of substantially rectangular unit cells, wherein each of said unit cells includes at least one of the plurality of isolated areas positioned proximate to a corresponding one of each of three corners of the unit cell and at least one of the plurality of assist features positioned proximate to the fourth corner of the unit cell.

58. A method of manufacturing a device using a lithographic apparatus, said method comprising:

imaging irradiated portions of a mask onto target portions of a substrate, wherein said mask is provided with a plurality of isolated areas that contrast with a background and represent features to be printed on a substrate, said isolated areas being arranged such that at least part of each isolated area is adjacent to at least part of at least one other isolated area, and a plurality of non-printing assist features smaller than said isolated areas, at least one of said plurality of assist features being arranged adjacent to a first edge of a first isolated area of the array and to a second edge of another isolated area, wherein the shortest distance between the first and second edges is at least twice the shortest distance from (A) the first edge to (B) an edge of the first isolated area opposite the first edge.

59. The mask according to claim 36, wherein said plurality of non-printing assist features are positioned to increase rotational symmetry of said array.

60. The mask according to claim 36, wherein said plurality of non-printing assist features are positioned to increase reflexive symmetry of said array.

61. The mask according to claim 36, wherein said plurality of non-punting assist features are positioned to increase translational symmetry of said array.

62. The mask according to claim 36, wherein said plurality of non-printing assist features are positioned to increase symmetry of said array along an axis of the array.

* * * * *

UNITED STATES PATENT AND TRADEMARK OFFICE

CERTIFICATE OF CORRECTION

PATENT NO. : 6,887,625 B2
DATED : May 3, 2005
INVENTOR(S) : Johannes Jacobus Matheus Baselmans et al.

It is certified that error appears in the above-identified patent and that said Letters Patent is hereby corrected as shown below:

Title page,
Item [73], Assignee, replace "ASML Netherlands B.V., Veldhoven (NL)" with -- ASML Netherlands B.V., Veldhoven (NL); ASML Masktools B.V., Veldhoven (NL) --.

Signed and Sealed this

Sixteenth Day of August, 2005

JON W. DUDAS

*Director of the United States Patent and Trademark Office*